(12) United States Patent
Thiele et al.

(10) Patent No.: US 6,562,664 B1
(45) Date of Patent: May 13, 2003

(54) METHOD FOR INSTALLING PROTECTIVE COMPONENTS IN INTEGRATED CIRCUITS THAT ARE CONSTRUCTED FROM STANDARD CELLS

(75) Inventors: Jörg Thiele, München (DE); Markus Hübl, Markt Schwaben (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/408,477

(22) Filed: Sep. 28, 1999

(30) Foreign Application Priority Data

Sep. 28, 1998 (DE) .......................... 198 44 405

(51) Int. Cl.⁷ .............................. H01L 21/82
(52) U.S. Cl. ................. 438/129; 438/130; 438/598; 438/599
(58) Field of Search ................ 438/14, 129, 130, 438/599, 618

(56) References Cited

U.S. PATENT DOCUMENTS 6,130,460 A * 10/2000 Borel ...................... 438/618
6,194,233 B1 * 2/2001 Bedner et al. ............... 438/14

OTHER PUBLICATIONS

Published International Application No. 97/35345 (Merrill et al.), dated Sep. 25, 1997.

* cited by examiner

Primary Examiner—Kevin M. Picardat
(74) Attorney, Agent, or Firm—Laurence A. Greenberg; Werner H. Stemer; Ralph E. Locher

(57) ABSTRACT

A method for installing protective components in integrated circuits constructed from standard cells includes reserving sufficient space in the standard cells for at least one protective component, wiring the standard cells and determining which standard cells require a protective component and inserting at least one protective component into the standard cells. A place marker can mark the space required for a protective component in the integrated circuit layout. The protective component can be a protective diode. Protective component connections can be provided in the standard cells. The standard cells can be gate arrays.

4 Claims, 1 Drawing Sheet

METHOD FOR INSTALLING PROTECTIVE COMPONENTS IN INTEGRATED CIRCUITS THAT ARE CONSTRUCTED FROM STANDARD CELLS

BACKGROUND OF THE INVENTION

Field of the Invention

The invention lies in the field of integrated circuits. The invention relates to a method for installing protective components in integrated circuits that are constructed from standard cells.

In integrated circuits, there is frequently a need for installing protective diodes (also referred to as "tie-down diodes") in order to conduct away loads that occur during integrated circuit fabrication when the metal layers are processed (i.e., during etching). Thus, it is known that during reactive ion etching ("RIE") charges generate, leading to voltages of up to several hundred volts. After assembly of an integrated circuit constructed from standard cells, in other words, after the standard cells have been interconnected, the voltage drop generated as a result of the charging is applied to, for example, the gate oxide of MOS field effect transistors contained in the standard cells. A voltage breakdown in the gate oxide usually leads merely to microscopic damage that, at first, does not adversely affect further operation of the circuit containing the transistor. However, the service life of such transistors is shortened, resulting in the premature failing of the integrated circuit as a whole for reasons that cannot be detected if a transistor ultimately becomes inoperable due to the microscopic damage.

It has become apparent that the area ratio (metal area/transistor area) is decisive for the failure of a transistor due to an excessively large voltage drop across its gate oxide. Specifically, if the area ratio is lower than a specific value, then there s no risk of the gate oxide being destroyed. If, however, the ratio is above the specific value, allowance must be made to address the fact that charges generated during metal layer processing lead to voltages which, after the interconnection of the standard cells, may lead to damage of the gate oxide of MOS field effect transistors.

In order to avoid the problem until now, protective diodes have been inserted into circuits that are optimized by the "full custom" method or are inserted "manually" into the respective layouts. The diodes are then installed in the actual integrated circuits. For an integrated circuit composed of standard cells, such a procedure is not possible because it is too costly to provide each of the numerous standard cells with a protective diode. An alternative is to install protective diodes in each standard cell, leading to use of a very large number of protective diodes. As a result of installing a large number of protective diodes, the integrated circuit is unnecessarily loaded with the capacitances of all the protective diodes—an addition that ultimately negatively influences the integrated circuit switching speed.

SUMMARY OF THE INVENTION

It is accordingly an object of the invention to provide a method for installing protective components in integrated circuits that are constructed from standard cells that overcomes the hereinafore-mentioned disadvantages of the heretofore-known devices and methods of this general type and that readily provides protective components in an economic way only in those standard cells that actually require the protective components.

With the foregoing and other objects in view, there is provided, in accordance with the invention, a method for installing protective components in integrated circuits that are constructed from standard cells, including the steps of (a) reserving sufficient space in standard cells for at least one protective component, (b) wiring the standard cells and determining which standard cells require a protective component and (c) inserting at least one protective component into those standard cells that require a protective component.

In accordance with another mode of the invention, there is provided the step of marking the space that is required for a protective component in the integrated circuit layout by a place marker.

In accordance with a further mode of the invention, a protective diode is advantageously provided as the protective component. However, the protective component can also be composed, for example, of a capacitor.

The method according to the invention is of particular advantage if integrated circuits are constructed from standard cell libraries. Application of the invention insures that protective components and, in particular, protective diodes, can be readily inserted at the locations marked by "place markers" and at the locations that actually require a protective component because the ratio of metal area to transistor area (metal area/transistor area) exceeds a specific value in the components.

In the method according to the invention, the space that is required for a protective component is, thus, reserved in each standard cell, so that the protective component can later be inserted within the standard cell when required. The planned installation area can be provided on the layout with a place marker as the marking function. Accordingly, a connection (for example) between a gate that is to be protected and a protective diode that may be inserted at a later time can advantageously be provided during the construction of the standard cell.

In accordance with an added mode of the invention, there is provided the step of providing protective component connections in the standard cells.

All the components of the individual standard cells or the gate oxides of standard cells that have to be protected by protective diodes are identified by a computer-aided design ("CAD") method applied after the standard cell is wired. Only the identified components are provided with corresponding protective diodes.

As such, installation of the protective components can be carried out automatically. Protective components are inserted only at those locations where they are actually required according to the configuration rules used and, in particular, according to the ratio (metal area)/(transistor area). As a result, installation of unnecessary parasitic capacitances is particularly avoided so as to prevent unnecessary degradation of integrated circuit switching speed. In other words, an integrated circuit that is fabricated using the method according to the invention has a considerably higher switching speed than an Integrated circuit in which all the standard cells are already equipped with protective components. Using the marking figures as place markers insures that the protective components can be readily inserted at a later time at suitable locations on the individual standard cells. Also notable is that the method according to the invention permits a considerable increase in integrated circuit yield and reliability in comparison with integrated circuits in which protective components, in particular, protective diodes, are not installed.

The standard cells may, for example, also be gate arrays. Accordingly, space is provided for protective diodes in the gate arrays. The protective diodes also can already be present in a standard cell master. When necessary, the respective protective diodes are installed in the corresponding gate arrays and can be activated, for example, by inserting contacts between the protective diodes and connections to the gates to be protected.

In accordance with a concomitant mode of the invention, the standard cells are gate arrays.

Other features that are considered as characteristic for the invention are set forth in the appended claims.

Although the invention is illustrated and described herein as embodied in a method for installing protective components in integrated circuits that are constructed from standard cells, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
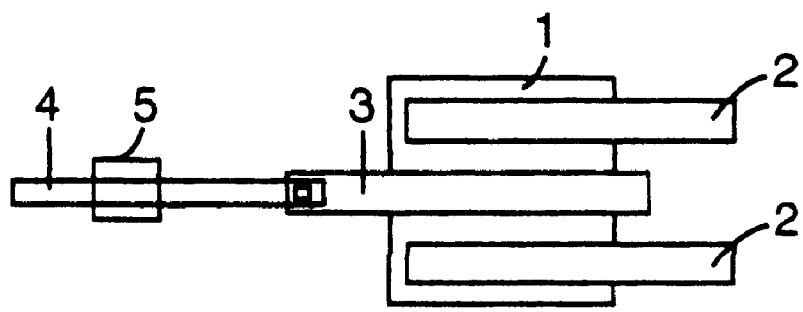
FIG. 1 is a diagrammatic view of a MOS field effect transistor with a marking figure according to the invention.

Referring now to the single figure of the drawing, the illustration shows a layout of a MOS field effect transistor with a marking figure, lying parallel to its gate electrode, for a protective diode.

A MOS transistor with diffusion regions 1, drain and source electrodes 2 and a gate electrode 3 is provided in a standard cell (not illustrated). If the ratio (metal area)/(transistor area) in the MOS field effect transistor is below a specific value, there is a risk that the gate electrode will be excessively loaded with voltages arising from charges produced during processing of an Integrated circuit constructed from standard cells. As a precaution, a protective diode (as an example of a protective component) should be provided parallel to the gate electrode. According to the invention, a space marker 5 is provided, in the integrated circuit layout, by a marking figure in a line 4 leading away from the gate electrode. A protective diode can be readily mounted at the place marker 5 after the Integrated circuit has been constructed from the individual standard cells.

After the actual construction of the integrated circuit from the standard cells, it is first determined which standard cells require a protective diode. The protective diodes are then inserted into the selected standard cells. Insertion is readily possible because the place markers 5 have already insured that sufficient space exists for placing the protective diodes within the layout.

Therefore, the present invention provides a method for readily providing protective components only for those standard cells that actually require protective components in an integrated circuit constructed from standard cells.

We claim:

1. A method for installing protective components in integrated circuits constructed from standard cells, which comprises:

(a) reserving sufficient space in the standard cells for at least one protective component and marking the reserved space in a layout of the integrated circuit with a place marker;

(b) wiring the standard cells and determining standard cells requiring a protective component; and (c) inserting at least one protective component into the standard cells requiring the protective component.

2. The method according to claim 1, wherein the step of inserting at least one protective component comprises inserting a protective diode.

3. The method according to claim 1, which comprises providing protective component connections in the standard cells.

4. The method according to claim 1, wherein the standard cells are gate arrays.

* * * * *